United States Patent
Yi et al.

(10) Patent No.: US 7,674,716 B2
(45) Date of Patent: *Mar. 9, 2010

(54) ADJUVANT FOR CHEMICAL MECHANICAL POLISHING SLURRY

(75) Inventors: Gi Ra Yi, Daejeon (KR); Jong Pil Kim, Daejeon (KR); Jung Hee Lee, Gyeonggi-do (KR); Jeong Jin Hong, Daejeon (KR); Young Jun Hong, Daejeon (KR); No Ma Kim, Daejeon (KR); An Na Lee, Daejeon (KR)

(73) Assignee: LG Chem. Ltd., Seoul (KR)

( * ) Notice: Subject to any disclaimer, the term of this patent is extended or adjusted under 35 U.S.C. 154(b) by 465 days.

This patent is subject to a terminal disclaimer.

(21) Appl. No.: 11/319,071

(22) Filed: Dec. 28, 2005

(65) Prior Publication Data
US 2006/0141741 A1    Jun. 29, 2006

(30) Foreign Application Priority Data
Dec. 29, 2004    (KR) .................. 10-2004-0114824
Nov. 25, 2005    (KR) .................. 10-2005-0113758

(51) Int. Cl.
*H01L 21/302* (2006.01)
(52) U.S. Cl. .................. 438/692; 216/89; 438/424
(58) Field of Classification Search ........... 438/692, 438/693, 691; 216/89
See application file for complete search history.

(56) References Cited

U.S. PATENT DOCUMENTS

| | | | |
|---|---|---|---|
| 5,614,444 A | 3/1997 | Farkas et al. | |
| 5,876,490 A | 3/1999 | Ronay | |
| 6,776,810 B1 * | 8/2004 | Cherian et al. | 51/307 |
| 6,824,579 B2 * | 11/2004 | Ronay | 51/307 |

FOREIGN PATENT DOCUMENTS

| | | |
|---|---|---|
| JP | 10-106988 | 4/1998 |
| JP | 10-154672 | 6/1998 |
| JP | 10-270401 | 10/1998 |
| JP | 2001-035820 | 2/2001 |
| JP | 2001-037951 | 2/2001 |
| JP | 2001-319900 | 11/2001 |
| KR | 2001-0108048 A | 12/2001 |
| KR | 2002-0015697 A | 2/2002 |
| KR | 10-2003-0039999 A | 5/2003 |
| KR | 10-2003-0089360 A | 11/2003 |
| KR | 10-2004-0013299 A | 2/2004 |
| KR | 10-2004-0057653 A | 7/2004 |
| WO | WO 00/39843 A1 | 7/2000 |
| WO | WO 2004/101702 A1 | 11/2004 |

* cited by examiner

*Primary Examiner*—Walter L Lindsay, Jr.
*Assistant Examiner*—Reema Patel
(74) *Attorney, Agent, or Firm*—McKenna Long&Aldridge LLP

(57) ABSTRACT

Disclosed is an adjuvant for use in simultaneous polishing of a cationically charged material and an anionically charged material, which forms a adsorption layer on the cationically charged material in order to increase the polishing selectivity of the anionically charged material to cationically charged material, wherein the adjuvant comprises a polyelectrolyte salt containing: (a) a graft type polyelectrolyte that has a weight average molecular weight of 1,000~20,000 and comprises a backbone and a side chain; and (b) a basic material. CMP (chemical mechanical polishing) slurry comprising the above adjuvant and abrasive particles is also disclosed.

24 Claims, 1 Drawing Sheet

ADJUVANT FOR CHEMICAL MECHANICAL POLISHING SLURRY

This application claims the benefit of Korean Application No. 10-2004-114824, filed Dec. 29, 2004, and Korean Application No. 10-2005-113758, filed Nov. 25, 2005, in Korean Industrial Property Office, which are hereby incorporated by reference in their entirety for all purposes as if fully set forth herein.

TECHNICAL FIELD

The present invention relates to an adjuvant for a CMP (chemical mechanical polishing) slurry, or an adjuvant for use in simultaneous polishing of a cationically charged material and an anionically charged material, which forms a adsorption layer on the cationically charged material in order to increase the polishing selectivity of the anionically charged material to cationically charged material.

BACKGROUND ART

As microelectronic devices are provided with a higher integration degree continuously, planarization processes used for manufacturing such microelectronic devices become more and more important. As a part of attempts to obtain highly integrated microelectronic devices, multiple interconnection technique and multilayer stacking technique are generally used for semiconductor wafers. However, non-planarization occurring after carrying out one of the above techniques causes many problems. Therefore, planarization processes are applied to various steps in a microelectronic device manufacturing process, so as to minimize irregularity on wafer surfaces.

One of these planarization techniques is CMP (chemical mechanical polishing) . During the process of CMP, a wafer surface is pressed against a polishing pad that rotates relative to the surface, and a chemical reagent known as CMP slurry is introduced into the polishing pad during the polishing process. Such CMP technique accomplishes planarization of a wafer surface by way of chemical and physical actions. In other words, CMP technique accomplishes planarization of a wafer surface by pressing the wafer surface against the polishing pad that rotates relative to the surface, and by supplying a chemically active slurry to the wafer surface having a pattern at the same time.

One embodiment, to which CMP technique is applied, is STI (shallow trench isolation). In the STI technique, relatively shallow trenches are formed, and such trenches are used in forming field regions for separating active regions on wafer surfaces.

As shown in FIG. 1, in the STI process, a pad silicon oxide ($SiO_2$) layer 101 and a silicon nitride (SiN) layer 102 are formed successively on a semiconductor wafer. Next, a photoresist pattern is formed on the SiN layer 102. Then, the SiN layer 102, the pad silicon oxide layer 101 and the semiconductor wafer 100 are partially etched by using the photoresist pattern as a mask, so that a plurality of trenches 103 is formed.

Further, in order to form field regions, an insulating silicon oxide layer 104 is deposited by way of LPCVD (low pressure chemical vapor deposition), PECVD (plasma enhanced chemical vapor deposition) or HDPCVD (high density plasma chemical vapor deposition) technique, so that the trenches 103 are filled with the layer 104 and the surface of the SiN layer 102 is covered with the layer 104.

Subsequently, the insulating silicon oxide layer 104 is polished until the SiN layer 102 is exposed. Additionally, the SiN layer 102 placed between two adjacent active regions, as well as the pad silicon oxide layer 101 is removed by etching. Finally, a gate silicon oxide layer 105 is formed on the surface of the semiconductor wafer.

Herein, during the progress of the CMP process for removing the insulating silicon oxide layer 104, the insulating silicon oxide layer 104 and the SiN layer 102 show different removal rates due to their different chemical and physical properties.

The ratio of the removal rate of the insulating silicon oxide layer to that of the silicon nitride layer is referred to as the selectivity of CMP slurry.

As the selectivity of CMP slurry decreases, the amount of the SiN layer, removed by the slurry, increases. It is preferable that the SiN layer is not removed. In other words, the selectivity of the insulating silicon oxide layer to the SiN layer should be infinite. However, conventional CMP slurry has a low polishing selectivity of the insulating silicon oxide layer to the SiN layer, which is about 4:1. Hence, the SiN layer is polished to a degree exceeding the acceptable range in a practical CMP process.

As a result, the SiN layer pattern may be removed non-uniformly depending on locations in a wafer during a CMP process. Therefore, the SiN layer has a variable thickness over the whole wafer. Particularly, this is a serious problem in the case of a semiconductor wafer that has a highly dense pattern simultaneously with a sparse pattern.

Due to the above-mentioned problem, a final structure having field regions has a level difference between active regions and field regions, resulting in reduction of the margin of subsequent steps for manufacturing a semiconductor device, and degradation of the quality of a transistor and a device. Briefly, conventional CMP processes are problematic in that a SiN layer pattern with a uniform thickness cannot be obtained even after removing the oxide layer via a CMP process.

To solve the problem, many attempts have been made recently to develop a slurry composition that can control the removal rate of the insulating silicon oxide layer to be higher than the polishing rate of the SiN layer. For example, such slurry composition is disclosed in U.S. Pat. No. 5,614,444; Japanese Laid-Open Patent Nos. 1998-106988, 1998-154672, 1998-270401, 2001-37951, 2001-35820 and 2001-319900; and Korean Laid-Open Patent Nos. 2001-108048, 2002-0015697, 2003-0039999, 2004-0057653, 2004-0013299 and 2003-0039999.

Although intensive research and development into a CMP slurry composition have been made continuously up to date in order to improve the selectivity expressed by the ratio of the polishing rate of an insulating silicon oxide layer to that of a SiN layer, such slurry composition still has much room for improvement.

DISCLOSURE OF THE INVENTION

Therefore, the present invention has been made in view of the above-mentioned problems. It is an object of the present invention to provide an adjuvant for use in simultaneous polishing of a structure of a cationically charged material and a structure of an anionically charged material, which forms a adsorption layer on the structure of the cationically charged material in order to increase the polishing selectivity of the structure of the anionically charged material. The present invention adopts a polyelectrolyte salt comprising a graft type polyelectrolyte (ionic polymer or macroion) having a weight average molecular weight controlled to 1,000~20,000, so as to minimize agglomeration of abrasive particles.

According to an aspect of the present invention, there is provided an adjuvant for use in simultaneous polishing of a cationically charged material and an anionically charged material, which forms a adsorption layer on the cationically charged material in order to increase the polishing selectivity of the anionically charged material, the adjuvant comprising a polyelectrolyte salt containing: (a) a graft type polyelectrolyte that has a weight average molecular weight of 1,000~20,000 and comprises a backbone and a side chain; and (b) a basic material. CMP slurry comprising the same adjuvant and abrasive particles is also provided.

According to another aspect of the present invention, there is provided an adjuvant for CMP slurry, which comprises a polyelectrolyte salt containing: (a) a graft type polyelectrolyte that has a weight average molecular weight of 1,000~20,000 and comprises a backbone and a side chain; and (b) a basic material. CMP slurry comprising the same adjuvant and abrasive particles is also provided.

According to still another aspect of the present invention, there is provided an STI (shallow trench isolation) method using the above CMP slurry.

According to yet another aspect of the present invention, there is provided a method for inhibiting a cationically charged material from being polished during a polishing process, by using a polyelectrolyte salt containing: (a) a graft type polyelectrolyte that has a weight average molecular weight of 1,000~20,000 and comprises a backbone and a side chain; and (b) a basic material.

Hereinafter, the present invention will be explained in more detail.

The present invention is characterized in that an anionically charged graft type polyelectrolyte having a weight average molecular weight of 1,000~20,000 is used in a polishing process in order to efficiently inhibit the structure of a cationically charged material from being polished, while minimizing agglomeration of particles such as abrasive particles.

In general, the surface of a silicon nitride is cationically charged and that of a silicon oxide is anionically charged. Therefore, in order to increase the polishing selectivity of silicon oxide to silicon nitride, an anionically charged polymer, such as a polyelectrolyte, is adsorbed onto the cationically charged silicon nitride via electrostatic force, so that the cationically charged silicon nitride is prevented from being polished, and thus the anionically charged silicon oxide becomes more amenable to polishing.

Herein, if the molecular weight of the anionically charged polymer is too low, the polymer is adsorbed onto the structure of a cationically charged material sparsely or in the form of a thin adsorption layer. Therefore, it is not possible to protect the structure of the cationically charged material sufficiently from the polishing work.

To ensure the protection of the cationically charged material during the polishing work, it is preferable that the anionically charged polymer has high molecular weight. However, if the molecular weight is too high, the polymer is partially adsorbed onto abrasive particles via van der waals force to cause agglomeration of the particles. Furthermore, such agglomerated particles may entail scratch during CMP process.

Therefore, the present invention is characterized in that in order to maximize the electrostatic adsorption of the anionically charged polymer onto the structure of the cationically charged material, as well as to minimize the adsorption due to the van der waals force, a graft type polyelectrolyte containing a backbone and a side chain is used instead of a linear polyelectrolyte. When comparing a graft type polyelectrolyte with a linear polyelectrolyte under the same molecular weight range, a backbone chain length of the graft type polyelectrolyte is shorter than the chain length of the linear polyelectrolyte, resulting in minimization of an agglomeration phenomenon. Additionally, the graft type polyelectrolyte, which has the side chain grafted to the backbone, can form a adsorption layer on the structure of the cationically charged material with higher polymer density per unit area, to a larger thickness, in proportion to the length of the side chain (see FIG. 2).

In brief, according to the present invention, a graft type polyelectrolyte is used instead of a linear polyelectrolyte. The graft type polyelectrolyte can be adsorbed selectively onto the structure of a cationically charged material to a large thickness with no need for increasing its molecular weight. Hence, the structure of the cationically charged material, selectively coated with the graft type polyelectrolyte via electrostatic force, is protected during polishing work, so that the polishing selectivity of the anionically charged material (e.g. silicon oxide) to a cationically charged material (e.g. silicon nitride) can be increased.

Meanwhile, if the adjuvant according to the present invention is used, it is possible to increase not only the polishing selectivity of the anionically charged material, but also that a non-charged material. Therefore, a non-charged structure is also included in the scope of the present invention as an equivalent of the anionically charged material.

As shown in FIG. 2, the graft type polyelectrolyte that may be used in the present invention is comprised of a backbone 200 and a side chain 201. The graft type polyelectrolyte may form a polyelectrolyte salt together with a basic material. Other forms of the graft type polyelectrolyte than the graft type polyelectrolyte salt may be used in the scope of the present invention.

According to the present invention, the graft type polyelectrolyte has a weight average molecular weight of 1,000~20,000, preferably of 3,000~15,000. If the graft type polyelectrolyte has a weight average molecular weight of less than 1,000 or of greater than 20,000, a stable slurry composition cannot be obtained. Additionally, if the polyelectrolyte has a weight average molecular weight of greater than 20,000, abrasive particles are agglomerated. Moreover, in the latter case, the polyelectrolyte is adsorbed onto the structure of the anionically charged material (e.g. silicon oxide) as well as onto the structure of the cationically charged material (e.g. silicon nitride), so that the polyelectrolyte serves as a protection layer during the polishing work. Thus the polishing rate of the structure of the cationically charged material and that of the structure of the anionically charged material decrease at the same time, resulting in reduction of the polishing selectivity.

Preferably, the side chain in the graft type polyelectrolyte preferably has a length corresponding to a molecular weight of 500~2,000, and the backbone in the graft type polyelectrolyte has a length corresponding to a molecular weight of 500~15,000. If the length of the side chain is too short, the polyelectrolyte cannot perform the protection function sufficiently due to the small coating thickness. On the other hand, if the length of the side chain is too long, agglomeration of particles may occur. Additionally, if the length of the backbone is too short, the polyelectrolyte results in poor adsorption. On the other hand, if the length of the backbone is too long, agglomeration of abrasive particles may occur.

The backbone of the polyelectrolyte serves as a major site participating in the electrostatic adsorption. Hence, the backbone preferably contains a large amount of anionic units for the purpose of adsorption onto the structure of the cationically charged material. For example, such anionic units comprise functional groups such as a carboxylic acid group as a part.

The side chain affects the electrostatic adsorption to a lower degree compared to the backbone. Hence, it is not necessary for the side chain to be anionically charged. However, the side chain should not be cationic. The side chain mainly serves to form the adsorption coating layer with a larger thickness.

Preferably, the side chain of the graft type polyelectrolyte comprises a macrounit derived from the polymerization or copolymerization of a hydroxyl group-, carboxyl group- and/or sulfonic acid group-containing ethylenically unsaturated monomer(s). Also, the backbone of the graft type polyelectrolyte comprises a unit derived from a carboxyl group-containing ethylenically unsaturated monomer.

In general, slurry for polishing uses water as a dispersion medium. Hence, it is preferable that the graft type polyelectrolyte is dissolved in water. Thus, it is also preferable that the macrounit forming the side chain of the graft type polyelectrolyte is hydrophilic, and preferably contains units derived from monomers with high affinity to water (for example, hydroxyl group-, carboxyl group-, and/or sulfonic acid group-containing ethylenically unsaturated monomers).

The macrounit is a short chain polymer, and is derived from a macromonomer polymerized from 8~16 sub-monomers and end-capped with a functional group. Because if the side chain comprising the macrounit is too long, an agglomeration phenomenon occurs and if the side chain comprising the macrounit is too short, the polyelectrolyte cannot perform the protection function.

The polyelectrolyte salt according to the present invention has a pH of 4.5~8.8, preferably of 6.0~7.5. If the pH is less than 4.5 or greater than 8.8, it is not possible to obtain a sufficient level of polishing selectivity.

For example, the graft type polyelectrolyte may be prepared by the method comprising the steps of: (i) polymerizing at least one sub-monomer to obtain a macromonomer that forms a side chain of a graft type polymer; and (ii) copolymerizing the macromonomer with a monomer that forms a backbone of the graft type polymer.

A preferred embodiment of the method for preparing the graft type polyelectrolyte according to the present invention comprises the steps of: (i) carrying out radical polymerization of a hydroxyl group-, carboxyl group- and/or sulfonic acid group-containing ethylenically unsaturated monomer(s) to obtain a macromonomer that forms a side chain of a graft type polymer; and (ii) copolymerizing the macromonomer with a carboxyl group-containing ethylenically unsaturated monomer that forms a backbone of the graft type polymer.

In general, the macromonomer may be obtained by the method that comprises introducing a carboxyl group into the end of a polymer by using a chain transfer agent such as mercaptopropionic acid, and then adding glycidyl methacrylate thereto to introduce an ethylenically unsaturated group to the end of the polymer (Japanese Laid-Open Patent No. Sho43-11224); the method of preparing a macromonomer by using 2,4-diphenyl-4-methyl-1-pentene as a addition-cleavage type chain transfer agent (Japanese Laid-Open Patent No. Hei7-002954); or the method of preparing a macromonomer by using a cobalt-based metal complex (Japanese Laid-Open Patent Nos. Hei6-23209 and Hei7-35411, and U.S. Pat. Nos. 4,694,054 and 4,886,861). However, in the present invention, it is preferable to prepare the macromonomer by using a cobalt-based metal complex that shows excellent characteristics in terms of controllability of molecular weight distribution and purity of the resultant macromonomer.

Preferably, the hydroxyl group-containing ethylenically unsaturated monomer used in step (i) is a C1~C12 hydroxyalkyl methacrylate, and particular examples thereof include hydroxyethyl methacrylate, hydroxypropyl methacrylate, hydroxybutyl methacrylate, or the like. Additionally, the carboxyl group-containing ethylenically unsaturated monomer that may be used includes carboxylic acid monomers such as acrylic acid, methacrylic acid, itaconic acid or maleic acid. Further, the sulfonic acid group-containing ethylenically unsaturated monomer that may be used includes styrene sulfonic acid or naphthalene sulfonic acid.

If desired, the macromonomer may be prepared by copolymerizing the hydroxyl group- and/or sulfonic acid group-containing ethylenically unsaturated monomer with the carboxyl group-containing ethylenically unsaturated monomer. In this case, it is preferable to use methacrylic acid or acrylic acid.

The hydroxyl group- and/or sulfonic acid group-containing ethylenically unsaturated monomer is preferably mixed with the carboxyl group-containing ethylenically unsaturated monomer in a weight ratio of 100:0~70:30, more preferably of 95:5~85:15. If the carboxyl group-containing ethylenically unsaturated monomer is used in an amount of greater than 30 parts by weight, the resultant slurry composition cannot provide high selectivity and sufficient stability.

The ethylenically unsaturated monomer may be polymerized by using a cobalt-based metal complex as a chain transfer agent. The polymerization is performed by solution polymerization with an organic solvent in the presence of a radical polymerization initiator. Otherwise, the ethylenically unsaturated monomer may be polymerized by emulsion polymerization in water. Particularly, solution polymerization is used preferably.

The cobalt-based metal complex that serves as a chain transfer agent includes diaquabis(boron difluoro-dimethyl glyoxime cobalt (II) or diaquabis(boron difluoro-diphenyl glyoxime) cobalt (II).

Preferably, the cobalt-based metal complex is used in an amount of 5~1,000 ppm based on the total weight of the monomers used in the preparation of the macromonomer. If the amount is less than 5 ppm, the molecular weight of the resultant macromonomer rapidly increases. If the amount is greater than 1,000 ppm, the Co-based metal complex adversely affects the quality of the final slurry composition.

The polymerization initiator that may be used includes an organic peroxide- or azo-based initiator. More preferably, azo-based initiators, such as 2,2-azobis-4-methoxy-2,4-dimethylvaleronitrile, 2,2-azobis-2,4-dimethylvaleronitrile, 2,2-azobis-isobutyronitrile, 2,2-azobis-2-methyl-butyronitrile, 2,2-azobis-cyclohexanecarbonitrile, or 2,2-azobis-cyanopentane, are used.

The polymerization initiator is used an amount of 0.1~5 parts by weight based on the total weight of the monomers used in the preparation of the macromonomer. If the amount is less than 0.1 parts by weight, conversion of the monomer is low. If the amount is greater than 5 parts by weight, the resultant macromonomer has low purity.

The organic solvents that may be used include aromatic compounds, aliphatic compounds, ketone, glycol ether, acetate, alcohol, or the like. Particular examples of the organic solvent include methyl ethyl ketone, isopropyl alcohol, propylene glycol methyl ether and n-butanol.

Then, the macromonomer obtained as described above is copolymerized with a monomer that forms the backbone of the graft type polymer, such as a carboxyl group-containing ethylenically unsaturated monomer to provide a final graft type polyelectrolyte.

As the carboxyl group-containing ethylenically unsaturated monomer, methacrylic acid or acrylic acid is preferably used. The carboxyl group-containing ethylenically unsaturated monomer is used in an amount of 65~100 parts by weight, more preferably in an amount of 70 parts by weight, based on the total weight of the backbone. If the amount is less than 65 parts by weight, sufficient electrostatic affinity is not obtained, so that the resultant polymer cannot be adsorbed selectively onto the structure of the cationically charged material (e.g. silicon nitride). Therefore, it is not possible to prevent such structure from being polished, resulting in degradation of the polishing selectivity.

When copolymerized with the macromonomer, the carboxyl group-containing ethylenically unsaturated monomer may be used in combination with a polymerizable ethylene group-containing monomer that is copolymerizable with the same, if desired.

Although there is no particular limitation in the polymerizable ethylene group-containing monomer, (meth)acrylate monomers are preferably used due to their good reactivity, and such monomers are used in an amount of at most 35 parts by weight based on the total weight of the backbone. If the amount is greater than 35 parts by weight, adsorption via electrostatic affinity cannot be accomplished. Moreover, the hydrophobic ethylene group-containing monomer increases the hydrophobicity of the backbone as if it serves as a surfactant, thereby increasing generation of air bubbles in the final slurry composition.

The initiator used for forming the backbone of the graft type polyelectrolyte, an organic peroxide initiator is preferably used. Particular examples of the initiator include benzoyl peroxide, lauryl peroxide, t-butylperoxy pivalate, t-amylperoxy pivalate, t-hexylperoxy pivalate, t-butylperoxy neodecanoate, t-hexylperoxyetyl hexanoate, or the like.

The organic solvents that may be used in the preparation of the backbone of the graft type polyelectrolyte include the same examples as the solvent as used in the preparation of the side chain of the same polyelectrolyte.

Additionally, the graft type polyelectrolyte may be converted into a graft type polyelectrolyte salt in an aqueous phase by using a basic material.

When the adjuvant of the present invention is used in CMP slurry, the basic materials that may be used include at least one material selected from the group consisting of ammonium hydroxide ($NH_4OH$) and basic amines, such as tetramethylammonium hydroxide, tetraethylammonium hydroxide, tetrapropylammonium hydroxide and tetrabutylammonium hydroxide.

In addition to the above-described adjuvant, the present invention also provides CMP slurry, which comprises: (i) an adjuvant comprising (a) a graft type polyelectrolyte that has a weight average molecular weight of 1,000~20,000 and comprises a backbone and a side chain, and (b) a basic material; (ii) abrasive particles; and (iii) water.

The polyelectrolyte salt is used in the CMP slurry preferably in an amount of 0.1~10 wt %. If the amount is less than 0.1 wt %, the polishing selectivity decreases. On the other hand, if the amount is greater than 10 wt %, the polishing selectivity decreases and agglomeration of the abrasive particles may occur.

The abrasive particles are used in the CMP slurry in an amount of 0.1~10 wt %. If the amount is less than 0.1 wt %, high removal rate of oxide layer cannot be achieved sufficiently. On the other hand, if the amount is greater than 10 wt %, the slurry shows poor stability.

As the abrasive particles, nano-sized ceramic abrasive particles, such as silica, alumina, zirconia, titania or cerium oxide particles may be used. Preferably, cerium oxide particles are used.

The CMP slurry may be prepared from the polyelectrolyte salt dissolved in a solvent (e.g. water), or from the abrasive particles dispersed in a dispersion medium (e.g. water). Preferably, the aqueous solution of the polyelectrolyte salt has a concentration of 3~3.5 wt %, and the water dispersion of the abrasive particles has a concentration of 4~6 wt %.

Therefore, the water forming the CMP slurry may come from the water present in the composition containing the polyelectrolyte salt or abrasive particles such as aqueous solution. Water is used in such an amount as to adjust the total weight of the slurry to 100 wt %. Preferably, water is used in an amount of 94~99.8 wt %. If the amount is less than 94 wt %, the slurry is degraded in terms of stability. If the amount is greater than 99.8 wt %, the removal rate is degraded.

Further, the present invention provides an STI (shallow trench isolation) method using the CMP slurry.

When the CMP slurry according to the present invention is used, it is possible to remove the SiN layer uniformly over the whole range of a wafer during a CMP process, due to a high selectivity of the silicon oxide layer to the silicon nitride layer. Hence, it is possible to minimize variations in the thickness. As a result, there is little difference between the levels of the active regions and those of the field regions, while not adversely affecting the quality of the transistor and the microelectronic device. Additionally, CMP work can be performed by using the slurry composition having high polishing selectivity and a low degree of agglomeration of abrasive particles. Therefore, the present invention may be applied suitably to the manufacture of a semiconductor device requiring a micropattern, thereby forming a high-quality micropattern and improving the reliability and productivity.

Further, the present invention provides a method for inhibiting a cationically charged material from being polished during a polishing process, by using a polyelectrolyte salt containing: (a) a graft type polyelectrolyte that has a weight average molecular weight of 1,000~20,000 and comprises a backbone and a side chain; and (b) a basic material.

A method for inhibiting an anionically charged material from being polished during a polishing process, by using a cationically charged graft type polymer comprising a backbone and a side chain, is also included in the scope of the present invention.

MODE FOR CARRYING OUT THE INVENTION

Figure 1:
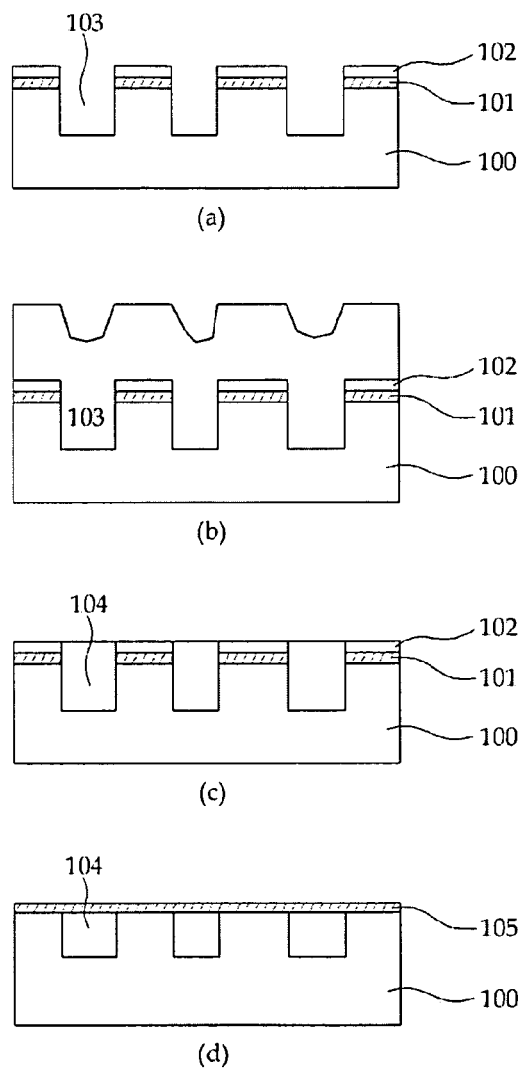
FIG. 1 is a flow chart illustrating a conventional STI (shallow trench isolation) process.

Reference will now be made in detail to the preferred embodiments of the present invention. It is to be understood that the following examples are illustrative only and the present invention is not limited thereto.

EXAMPLE 1

Preparation of Adjuvant for CMP Slurry (Preparation of Macromonomer)

To a 500 mL four-neck flask equipped with a stirrer, thermometer, nitrogen gas inlet and a condenser, 75 parts by weight of isopropyl alcohol were introduced, and the mixture was bubbled with nitrogen at the reflux temperature for about 20 minutes. Next, 0.032 g of bis(boron difluorodiphenyl glyoxime)Co (II) was dissolved in 80 g of methyl ethyl ketone, and was added dropwide to the above reactor over approximately 270 minutes. Simultaneously with this, monomers containing 10 parts by weight of methacrylic acid and 90 parts by weight of hydroxyethyl methacrylate, and a polymerization initiator solution comprising 1 g of 2,2-azobis-2-methyl-butyronitrile dissolved in 49 g of isopropyl alcohol were added dropwise for about 240 minutes and 270 minutes, respectively. After the completion of the addition of the polymerization initiator solution, the reaction mixture was maintained at the reflux temperature for about 30 minutes, and then was cooled to room temperature to obtain a macromonomer solution with a solid content of 35%. The macromonomer was analyzed by using an NMR spectrometer, and the macromonomer had a molecular weight of 1,300 and a polymerization degree of 10. After the macromonomer was analyzed by thermogravimetry, the macromonomer had a purity of about 92%.

(Preparation of Graft Type Polyelectrolyte)

To a 500 mL four-neck flask equipped with a stirrer, thermometer, nitrogen gas inlet and a condenser, 120 parts by weight of isopropyl alcohol, 30 parts by weight of the above macromonomer, 2.9 parts by weight of methyl methacrylate, 2.9 parts by weight of acrylic acid and 4.2 parts by weight of methacrylic acid were introduced, and the mixture was bubbled at the reflux temperature for about 10 minutes.

To the mixture, 0.2 parts by weight of t-amyl peroxy pivalate was introduced as an initiator, and monomers containing 17.2 parts by weight of methyl methacrylate, 17.2 parts by weight of acrylic acid and 25.6 parts by weight of methacrylic acid, and 1.0 parts by weight of t-amyl peroxy pivalate were added dropwise over approximately 2 hours. Next, 0.3 parts by weight of t-amyl peroxy pivalate were added dropwise thereto over 10 minutes, and the reaction mixture was left at the reflux temperature for about 10 minutes and cooled to room temperature to obtain a graft type polyelectrolyte solution with a solid content of about 38%. After the product was analyzed by GPC (Gel Permeation Chromatography), the graft type polyelectrolyte had a weight average molecular weight of 10,000. NMR analysis and thermogravimetric analysis of the product showed no characteristic peaks of unsaturated carbon atoms.

(Preparation of Graft Type Polyelectrolyte Salt)

To the solution of the graft type polyelectrolyte obtained as described above, aqueous ammonium hydroxide solution was added in order to convert the polyelectrolyte into a polyelectrolyte salt, and the remaining isopropyl alcohol was removed under vacuum at reduced pressure to obtain an aqueous solution of the graft type polyelectrolyte salt with a solid content of 10.5% and a pH of 6.5.

(Preparation of Adjuvant for CMP Slurry)

Water was added to the solution of the graft type polyelectrolyte salt until the final concentration reached 3 wt %. To the diluted solution, ammonium hydroxide was added to control the pH of the solution to 7.1. Finally, a final adjuvant for CMP slurry was obtained.

EXAMPLE 2

Preparation of Adjuvant for CMP Slurry (Preparation of Macromonomer)

A macromonomer was prepared in the same manner as described in Example 1.

(Preparation of Graft Type Polyelectrolyte)

To a 500 mL four-neck flask equipped with a stirrer, thermometer, nitrogen gas inlet and a condenser, 120 parts by weight of isopropyl alcohol, 30 parts by weight of the above macromonomer, 2.9 parts by weight of methyl methacrylate, and 7.1 parts by weight of acrylic acid were introduced, and the mixture was bubbled at the reflux temperature for about 10 minutes.

To the mixture, 0.2 parts by weight of t-amyl peroxy pivalate was introduced as an initiator, and monomers containing 17.2 parts by weight of methyl methacrylate and 42.8 parts by weight of acrylic acid, and 1.0 parts by weight of t-amyl peroxy pivalate were added dropwise over approximately 2 hours. Next, 0.3 parts by weight of t-amyl peroxy pivalate were added dropwise thereto over 10 minutes, and the reaction mixture was left at the reflux temperature for about 10 minutes and cooled to room temperature to obtain a graft type polyelectrolyte solution with a solid content of about 37%. After the product was analyzed by GPC (Gel Permeation Chromatography), the graft type polyelectrolyte had a weight average molecular weight of 10,000. NMR analysis and thermogravimetric analysis of the product showed no characteristic peaks of unsaturated carbon atoms.

(Preparation of Graft Type Polyelectrolyte Salt)

A graft type polyelectrolyte salt was obtained in the same manner as described in Example 1.

(Preparation of Adjuvant for CMP Slurry)

An adjuvant for CMP slurry was obtained in the same manner as described in Example 1.

EXAMPLE 3

Preparation of Adjuvant for CMP Slurry (Preparation of Macromonomer)

A macromonomer solution was obtained in the same manner as described in Example 1, except that 100 parts by weight of hydroxyethyl methacrylate were used instead of the monomers containing 10 parts by weight of methacrylic acid mixed with 90 parts by weight of hydroxyethyl methacrylate. The macromonomer obtained in this Example had a molecular weight of 1,000, a polymerization degree of 8, and a purity of about 96%.

(Preparation of Graft Type Polyelectrolyte)

To a 500 mL four-neck flask equipped with a stirrer, thermometer, nitrogen gas inlet and a condenser, 120 parts by weight of isopropyl alcohol, 30 parts by weight of the above macromonomer, 4.3 parts by weight of methyl methacrylate, and 5.3 parts by weight of acrylic acid were introduced, and the mixture was bubbled at the reflux temperature for about 10 minutes.

To the mixture, 0.2 parts by weight of t-amyl peroxy pivalate was introduced as an initiator, and monomers containing 25.7 parts by weight of methyl methacrylate, 34.3 parts by weight of acrylic acid and 25.6 parts by weight of methacrylic acid, and 1.0 parts by weight of t-amyl peroxy pivalate were added dropwise over approximately 2 hours. Next, 0.3 parts by weight of t-amyl peroxy pivalate were added dropwise thereto over 10 minutes, and the reaction mixture was left at the reflux temperature for about 10 minutes and cooled to room temperature to obtain a graft type polyelectrolyte solution with a solid content of about 38%.

After the product was analyzed by GPC (Gel Permeation Chromatography), the graft type polyelectrolyte had a weight average molecular weight of 10,000. NMR analysis and thermogravimetric analysis of the product showed no characteristic peaks of unsaturated carbon atoms.

(Preparation of Graft Type Polyelectrolyte Salt)

A graft type polyelectrolyte salt was obtained in the same manner as described in Example 1.

(Preparation of Adjuvant for CMP Slurry)

An adjuvant for CMP slurry was obtained in the same manner as described in Example 1.

EXAMPLE 4

Preparation of CMP Slurry

CMP slurry was prepared by mixing 5 wt % of a cerium oxide slurry composition as an abrasive particle composition (HIHC-1, LG Chem., Ltd.), the adjuvant for CMP slurry according to Example 1, and water in a volume ratio of 1:3:3.

EXAMPLE 5

Preparation of CMP Slurry

CMP slurry was prepared in the same manner as described in Example 4, except that the adjuvant for CMP slurry according to Example 2 was used instead of the adjuvant for CMP slurry according to Example 1.

EXAMPLE 6

Preparation of CMP Slurry

CMP slurry was prepared in the same manner as described in Example 4, except that the adjuvant for CMP slurry according to Example 3 was used instead of the adjuvant for CMP slurry according to Example 1.

The following test was performed out by using each CMP slurry according to the above Examples 4~6 in order to measure the pH, average agglomerated particle size (nm), oxide layer removal rate (Å/min.), nitride layer removal rate (Å/min.) and the polishing selectivity. The results are shown in the following Table 1.

TABLE 1

|  | Example 4 | Example 5 | Example 6 |
|---|---|---|---|
| Concentration of Adjuvant for CMP Slurry (wt %) | 1.3 | 1.3 | 1.3 |
| PH | 7.66 | 7.35 | 7.00 |
| Average agglomerated particle size (nm) | 535 | 685 | 734 |
| Oxide layer removal rate(Å/min) | 3,134 | 3,935 | 3,201 |
| Nitride layer removal rate (Å/min) | 42 | 43 | 43 |
| Selectivity | 74.6 | 91.5 | 74.4 |

COMPARATIVE EXAMPLE 1 AND EXAMPLES 7~10

Preparation of CMP Slurry

First, 5 wt % of a cerium oxide slurry composition (abrasive particle composition, HIHC-1, LG Chem., Ltd.) and the adjuvant for CMP slurry according to Example 1 were mixed in a volume ratio of 1:7. Then, the mixture was diluted with water to adjust the concentration of the adjuvant for CMP slurry to 0 wt % (Comparative Example 1), 0.42 wt % (Example 7), 0.85 wt % (Example 8), 1.3 wt % (Example 9), and 1.5 wt % (example 10).

Each CMP slurry according to Comparative Example 1 and Examples 7~10 was used to measure the pH, average agglomerated particle size (nm), oxide layer removal rate (Å/min.), nitride layer removal rate (Å/min.) and the polishing selectivity, in the same manner as described above. The results are shown in the following Table 2.

TABLE 2

|  | Comp. Ex. 1 | Example 7 | Example 8 | Example 9 | Example 10 |
|---|---|---|---|---|---|
| Concentration of adjuvant for CMP slurry (wt %) | 0.0 | 0.42 | 0.85 | 1.3 | 1.5 |
| pH | 7.84 | 7.93 | 7.83 | 7.72 | 7.67 |
| Average agglomerated particle size (nm) | 240 | 881 | 835 | 617 | 557 |
| Oxide layer removal rate(Å/min) | 3,854 | 3,516 | 3,145 | 2,944 | 2,761 |
| Nitride layer removal rate (Å/min) | 829 | 66 | 37 | 38 | 40 |
| Selectivity | 5 | 53 | 85 | 77 | 69 |

(a) The pH was measured by using a pH measuring device (Corning pH meter 445).

(b) The average agglomerated particle size was measured by using a light scattering device (Dynamic Light Scattering, Microtrap UPA150, Honeywell Inc., USA).

(c) The oxide layer removal rate was obtained by measuring the thickness of the oxide layer, before and after polishing, by using Nanospec 6100 available from Nanometrics Co., and then calculating the thickness difference.

(d) The nitride layer removal rate was obtained by measuring the thickness of the nitride layer, before and after polishing, by using Nanospec 6100 available from Nanometrics Co., and then calculating the thickness difference.

(e) The selectivity was measured by dividing the oxide layer removal rate by the nitride layer removal rate.

COMPARATIVE EXAMPLE 2

(Preparation of Adjuvant for CMP Slurry)

Example 1 was repeated to provide an adjuvant for CMP slurry, except that a solution of polyelectrolyte salt comprises a linear anionic polyelectrolyte of polyacrylic acid having a weight average molecular weight of 10,000 and sodium hydroxide, was used.

(Preparation of CMP Slurry)

CMP slurry was prepared by mixing 5 wt % of a cerium oxide slurry composition (HIHC-1, LG Chem., Ltd.) as an abrasive particle composition, the adjuvant for CMP slurry obtained as described above, and water in a volume ratio of 1:3:3.

COMPARATIVE EXAMPLE 3

(Preparation of Adjuvant for CMP Slurry)

Figure 2:
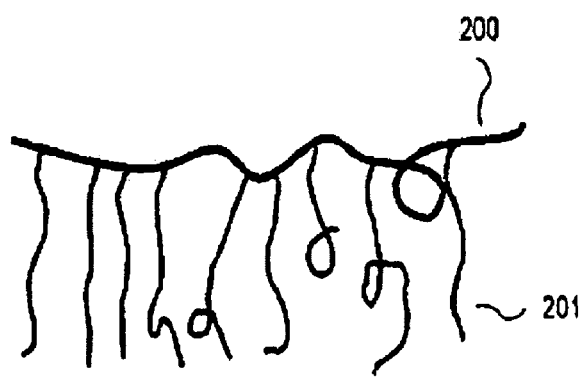
FIG. 2 is a schematic view showing the structure of a graft type polyelectrolyte according to a preferred embodiment of the present invention.

Example 1 was repeated to provide an adjuvant for CMP slurry, except that a commercially available glidant (Trade name CD-WB, LG Chem., Ltd.), i.e. a solution of polyelectrolyte salt, which has a weight average molecular weight of 21,000 and comprises an anionic polyelectrolyte represented by the structure as shown in FIG. 2 and sodium hydroxide, was used.

(Preparation of CMP Slurry)

CMP slurry was prepared by mixing 5 wt % of a cerium oxide slurry composition (HIHC-1, LG Chem., Ltd.) as an abrasive particle composition, the adjuvant for CMP slurry obtained as described above, and water in a volume ratio of 1:3:3.

COMPARATIVE EXAMPLE 4

(Preparation of Adjuvant for CMP Slurry)

Example 1 was repeated to provide an adjuvant for CMP slurry, except that a commercially available glidant (Trade name CD-WR, LG Chem., Ltd.), i.e. a solution of polyelectrolyte salt, which has a weight average molecular weight of 25,000 and comprises an anionic polyelectrolyte represented by the structure as shown in FIG. 2 and sodium hydroxide, was used.

(Preparation of CMP Slurry)

CMP slurry was prepared by mixing 5 wt % of a cerium oxide slurry composition (HIHC-1, LG Chem., Ltd.) as an abrasive particle composition, the adjuvant for CMP slurry obtained as described above, and water in a volume ratio of 1:3:3.

Each CMP slurry according to Comparative Examples 2~4 was used to measure the pH, average agglomerated particle size (nm), oxide layer removal rate (Å/min.), nitride layer removal rate (Å/min.) and the polishing selectivity, in the same manner as described above. The results are shown in the following Table 3.

TABLE 3

|  | Comp. Ex. 2 | Comp. Ex. 3 | Comp. Ex. 4 |
|---|---|---|---|
| Concentration of adjuvant for CMP Slurry (wt %) | 1.3 | 1.3 | 1.3 |
| pH | 7.29 | 8.25 | 7.93 |
| Average agglomerated particle size (nm) | 967 | 806 | 758 |
| Oxide layer removal rate (Å/min) | 2,703 | 4,092 | 4,117 |
| Nitride layer removal rate (Å/min) | 49 | 903 | 408 |
| Selectivity | 55 | 4.5 | 10.1 |

As shown in the above Table 3, use of the anionic polyelectrolyte having a molecular weight of greater than 20,000 (Comparative Examples 3 and 4) results in degradation of the polishing selectivity.

Therefore, as can be seen from the results as shown in the above Tables 1~3, the CMP slurry according to the present invention (Examples 4~10) shows an same or improved average agglomerated particle size, oxide layer removal rate and nitride layer removal rate, as compared to each CMP slurry according to Comparative Examples 1~4. Particularly, the CMP slurry according to the present invention can provide excellent polishing selectivity.

INDUSTRIAL APPLICABILITY

As can be seen from the foregoing, the adjuvant for CMP slurry according to the present invention, which comprises a polyelectrolyte salt containing a graft type polyelectrolyte that has a controlled weight average molecular weight of 1,000~20,000, is applied to a process for simultaneous polishing of a cationically charged material and an anionically charged material. Here, the polyelectrolyte salt forms an adsorption layer on the structure of the cationically charged material in order to increase the polishing selectivity of the structure of the anionically charged material, and to minimize agglomeration of abrasive particles.

While this invention has been described in connection with what is presently considered to be the most practical and preferred embodiment, it is to be understood that the invention is not limited to the disclosed embodiment and the drawings. On the contrary, it is intended to cover various modifications and variations within the spirit and scope of the appended claims.

The invention claimed is:

1. An adjuvant for use in simultaneous polishing of a cationically charged material and an anionically charged material, which forms an adsorption layer on the cationically charged material in order to increase polishing selectivity of the anionically charged material, wherein the adjuvant comprises a polyelectrolyte salt containing:
(a) an anionically charged graft type polyelectrolyte that has a weight average molecular weight of 1,000-20,000 and comprises a backbone and a side chain; and
(b) a basic material,
and the adjuvant is obtained by a method comprising the steps of:
(i) polymerizing at least one sub-monomer to obtain a macromonomer that forms the side chain of the graft type polyelectrolyte; and
(ii) copolymerizing the macromonomer with a monomer that forms the backbone of the graft type polyelectrolyte.

2. The adjuvant according to claim 1, wherein the side chain has a length corresponding to a molecular weight of 500-2,000, and the backbone has a length corresponding to a molecular weight of 500-15,000.

3. The adjuvant according to claim 1, wherein the graft type polyelectrolyte comprises:
a macrounit derived from polymerization or copolymerization of ethylenically unsaturated monomers containing at least one functional group selected from a hydroxyl group, a carboxyl group and a sulfonic acid group, as the side chain; and
a unit derived from carboxyl group-containing ethylenically unsaturated monomers, as the backbone.

4. The adjuvant according to claim 3, wherein the macrounit is obtained by copolymerization of ethylenically unsaturated monomers containing at least one functional group selected from the group consisting of a hydroxyl group and a sulfonic acid group with ethylenically unsaturated monomers containing a carboxyl group.

5. The adjuvant according to claim 3, wherein the unit derived from the ethylenically unsaturated monomer containing a carboxyl group, which is present on the backbone of the graft type polyelectrolyte, is used in an amount of 65-100 parts by weight based on the total weight of the backbone.

6. The adjuvant according to claim 1, wherein the basic material (b) is ammonium hydroxide or a basic amine.

7. The adjuvant according to claim 1, wherein the polyelectrolyte salt has a pH of 4.5-8.8.

8. An adjuvant for CMP (chemical mechanical polishing) slurry, which comprises a polyelectrolyte salt containing:

(a) an anionically charged graft type polyelectrolyte that has a weight average molecular weight of 1,000-20,000 and comprises a backbone and a side chain; and
(b) a basic material,
and which is obtained by a method comprising the steps of:
(i) polymerizing at least one sub-monomer to obtain a macromonomer that forms the side chain of the graft type polyelectrolyte; and
(ii) copolymerizing the macromonomer with a monomer that forms the backbone of the graft type polyelectrolyte.

9. The adjuvant according to claim 8, wherein the side chain has a length corresponding to a molecular weight of 500-2,000, and the backbone has a length corresponding to a molecular weight of 500-15,000.

10. The adjuvant according to claim 8, wherein the graft type polyelectrolyte comprises:
a macrounit derived from polymerization or copolymerization of ethylenically unsaturated monomers containing at least one functional group selected from a hydroxyl group, a carboxyl group and a sulfonic acid group, as the side chain; and
a unit derived from carboxyl group-containing ethylenically unsaturated monomers, as the backbone.

11. The adjuvant according to claim 8, wherein the graft type polyelectrolyte is obtained by a method comprising the steps of:
(i) carrying out radical polymerization of ethylenically unsaturated monomers containing at least one functional group selected from the group consisting of a hydroxyl group, carboxyl group and a sulfonic acid group to obtain a macromonomer; and
(ii) copolymerizing the macromonomer with a carboxyl group-containing ethylenically unsaturated monomer.

12. The adjuvant according to claim 11, wherein the ethylenically unsaturated monomer containing a hydroxyl group is a C1-C12 hydroxyalkyl methacrylate.

13. The adjuvant according to claim 10, wherein the macrounit is obtained by copolymerization of ethylenically unsaturated monomers containing at least one functional group selected from the group consisting of a hydroxyl group and a sulfonic acid group with ethylenically unsaturated monomers containing a carboxyl group.

14. The adjuvant according to claim 13, wherein the ethylenically unsaturated monomers containing a carboxyl group is used in an amount of at most 30 parts by weight based on the total weight of the ethylenically unsaturated monomers containing at least one functional group selected from the group consisting of a hydroxyl group and a sulfonic acid group.

15. The adjuvant according to claim 10, wherein the unit derived from the ethylenically unsaturated monomer containing a carboxyl group, which is present on the backbone of the graft type polyelectrolyte, is derived from methacrylic acid or acrylic acid.

16. The adjuvant according to claim 10, wherein the unit derived from the ethylenically unsaturated monomer containing a carboxyl group, which is present on the backbone of the graft type polyelectrolyte, is used in an amount of 65~100 parts by weight based on the total weight of the backbone.

17. The adjuvant according to claim 11, wherein the ethylenically unsaturated monomer containing a carboxyl group, is used in combination with a polymerizable ethylene group-containing monomer, in step (ii).

18. The adjuvant according to claim 17, wherein the polymerizable ethylene group-containing monomer is (meth) acrylate monomer.

19. The adjuvant according to claim 8, wherein the basic material (b) is ammonium hydroxide or a basic amine.

20. The adjuvant according to claim 8, wherein the polyelectrolyte salt has a pH of 4.5-8.8.

21. CMP (chemical mechanical polishing) slurry comprising:
(a) an adjuvant;
(b) abrasive particles; and
(c) water,
wherein the adjuvant comprises a polyelectrolyte salt containing:
(a) an anionically charged graft type polyelectrolyte that has a weight average molecular weight of 1,000-20,000 and comprises a backbone and a side chain; and
(b) a basic material,
and the adjuvant is obtained by a method comprising the steps of:
(a) polymerizing at least one sub-monomer to obtain a macromonomer that forms the side chain of the graft type polyelectrolyte; and
(b) copolymerizing the macromonomer with a monomer that forms the backbone of the graft type polyelectrolyte.

22. The CMP slurry according to claim 21, which comprises 0.1-10 wt % of the adjuvant; 0.1-10 wt % of the abrasive particles; and the balance amount of water based on 100 wt % of the total weight of the slurry.

23. An STI (shallow trench isolation) method comprising the steps of:
forming a silicon oxide layer and a silicon nitride layer successively on a semiconductor wafer;
forming a plurality of trenches on the wafer;
depositing insulating silicon oxide layer on the wafer; and
polishing the insulating silicon oxide layer until the silicon nitride layer is exposed using a CMP (chemical mechanical polishing) slurry,
wherein the CMP (chemical mechanical polishing) slurry comprises:
(a) an adjuvant;
(b) abrasive particles; and
(c) water,
wherein the adjuvant comprises a polyelectrolyte salt containing:
(a) an anionically charged graft type polyelectrolyte that has a weight average molecular weight of 1,000-20,000 and comprises a backbone and a side chain; and
(b) a basic material,
and the adjuvant is obtained by a method comprising the steps of:
(a) polymerizing at least one sub-monomer to obtain a macromonomer that forms the side chain of the graft type polyelectrolyte; and
(b) copolymerizing the macromonomer with a monomer that forms the backbone of the graft type polyelectrolyte.

24. A method for inhibiting a cationically charged material from being polished during a polishing process and polishing a structure of the cationically charged material and a structure of an anionically charged material simultaneously, comprising a step of forming an adsorption layer of a polvelectrolyte on a structure of the cationically charged material,
wherein the method uses a polyelectrolyte salt containing:
(a) an anionically charged graft type polyelectrolyte that has a weight average molecular weight of 1,000-20,000 and comprises a backbone and a side chain; and
(b) a basic material,
wherein the polyelectrolyte is obtained by a method comprising the steps of:
(a) polymerizing at least one sub-monomer to obtain a macromonomer that forms the side chain of the graft type polyelectrolyte; and
(b) copolymerizing the macromonomer with a monomer that forms the backbone of the graft type polyelectrolyte.

* * * * *